US007181381B1

(12) United States Patent
Akkaram et al.

(10) Patent No.: US 7,181,381 B1
(45) Date of Patent: Feb. 20, 2007

(54) METHOD, SYSTEM AND COMPUTER PRODUCT FOR PERFORMING NEW MATERIAL DEVELOPMENT

(75) Inventors: Srikanth Akkaram, Troy, NY (US); Dongming Gao, Clifton Park, NY (US); Youdong Zhou, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 776 days.

(21) Appl. No.: 10/065,740

(22) Filed: Nov. 14, 2002

(51) Int. Cl.
G06G 7/48 (2006.01)
G06G 7/58 (2006.01)

(52) U.S. Cl. .................................. 703/12; 703/2; 703/7
(58) Field of Classification Search .................... 703/2, 703/7, 9, 12
See application file for complete search history.

(56) References Cited

U.S. PATENT DOCUMENTS

| 6,853,952 | B2* | 2/2005 | Chadwick | 702/181 |
| 2002/0194044 | A1* | 12/2002 | Lablanc et al. | 705/8 |
| 2005/0192783 | A1* | 9/2005 | Lystad et al. | 703/3 |

OTHER PUBLICATIONS

Wang, Lihui et al., "A Java 3D-Enabled Cyber Workspace." Communications of the ACM. Nov. 2002, vol. 45, Issue 11, pp. 45-49.*

Chawla, R. et al., "A Virtual Environment for Simulating Manufacturing Operations in 3D." Proc. of the 2001 Winter Simulation Conf., Jan. 9-12, 2001. vol. 2, pp. 991-997.*

Atkinson, M. and O. Peter Buneman, "Types and Persistence in Database Programming Language." ACM Computing Surveys (CSUR), Jun. 1987, vol. 19, Issue 2, pp. 105-170.*

* cited by examiner

Primary Examiner—Paul Rodriguez
Assistant Examiner—Ayal I. Sharon
(74) Attorney, Agent, or Firm—Fletcher Yoder

(57) ABSTRACT

A method for performing new material development. The method comprises receiving a user simulation scenario from a user wherein the user simulation scenario is in a-cyclic graph format and includes a plurality of material development modules represented as vertices. The user simulation scenario also includes a starting module. Each vertex includes data information including at least one input file source and at least one output file destination. Relationships between the modules are represented as edges and each edge includes at least one of previous module and subsequent module. Each edge also includes data flow information between the previous module and the subsequent module. The method further comprises receiving a request to invoke the user simulation scenario and the request includes the input file source for the starting module. Traversing the vertices along the edges is performed in response to receiving the request and to the data flow information. The traversing includes executing the modules associated with each vertex beginning with the starting module in an order specified by the edges and the executing results in data being written to the output file destination for each vertex.

37 Claims, 8 Drawing Sheets

METHOD, SYSTEM AND COMPUTER PRODUCT FOR PERFORMING NEW MATERIAL DEVELOPMENT

CROSS REFERENCE TO RELATED APPLICATIONS

The U.S. Government may have certain rights in this invention pursuant to contract number 212976 awarded by the U.S. Department of Defense Advanced Research Projects Agency.

BACKGROUND OF INVENTION

The present disclosure relates generally to a method for performing new material development and in particular, to a method of performing simulation for new material development.

Developing new materials for introduction into commercial products can be a lengthy process that includes numerous simulations as well as experimental testing of various properties associated with the new material. An increasing number of software tools exist on the marketplace to perform particular components of simulation related to a new material. These tools have been customized to perform particular parts of the simulation process. For example, software material development modules used in simulation are customized to perform flow stress simulation, tensile modeling, heat treatment simulation and error propagation. These modules are often from different vendors and use different data formats and user interfaces. Users, such as designers and material developers, must be familiar with the data format requirements of each module and must learn a variety of user interfaces in order to execute a simulation that involves more than one module or tool. In addition, these modules may be executed on different computer platforms by different users and the associated data may be stored in a variety of locations. Again, this can place a burden on the designers and material developers to be knowledgeable about a variety of computer platforms and to find the correct version of the data for input to the simulation. Tracking the data associated with a particular material through all simulation runs and assessing a status of the material midway through the material development testing is difficult because of the variety of tools and data locations. Therefore, typically, the new material is released for use in a product and its attributes are described to the product designers after all of the simulation and testing has been completed by the material developers.

SUMMARY OF INVENTION

One aspect of the invention is a method for performing new material development. The method comprises receiving a user simulation scenario from a user wherein the user simulation scenario is in an a-cyclic graph format and includes a plurality of material development modules represented as vertices. The user simulation scenario also includes a starting module. Each vertex includes data information including at least one input file source and at least one output file destination. Relationships between the modules are represented as edges and each edge includes at least one of previous module and subsequent module. Each edge also includes data flow information between the previous module and the subsequent module. The method further comprises receiving a request to invoke the user simulation scenario and the request includes the input file source for the starting module. Traversing the vertices along the edges is performed in response to receiving the request and to the data flow information. The traversing includes executing the modules associated with each vertex beginning with the starting module in an order specified by the edges and the executing results in data being written to the output file destination for each vertex.

Another aspect of the invention is a system for performing new material development. The system comprises a network, a user system in communication with the network, a first storage device including a database component and a first host system. The first host system is in communication with the network and the first storage device and the host system includes an integration component to implement a method comprising receiving a user simulation scenario from a user system via the network. The user simulation scenario is in a-cyclic graph format and includes a plurality of material development modules represented as vertices. The user simulation scenario also includes a starting module. Each vertex includes data information including at least one input file source and at least one output file destination. Relationships between the modules are represented as edges and each edge includes at least one of previous module and subsequent module. Each edge also includes data flow information between the previous module and the subsequent module. The method further comprises receiving a request via the network to invoke the user simulation scenario and the request includes the input file source for the starting module. Traversing the vertices along the edges is performed in response to receiving the request and to the data flow information. The traversing includes executing the modules associated with each vertex beginning with the starting module in an order specified by the edges and the executing results in data being written to the output file destination located on the database component for each vertex.

A further aspect of the invention is a computer program product for performing new material development. The computer program product comprises a storage medium readable by a processing circuit and storing instructions for execution by the processing circuit for performing a method. The method comprises receiving a user simulation scenario from a user wherein the user simulation scenario is in an a-cyclic graph format and includes a plurality of material development modules represented as vertices. The user simulation scenario also includes a starting module. Each vertex includes data information including at least one input file source and at least one output file destination. Relationships between the modules are represented as edges and each edge includes at least one of previous module and subsequent module. Each edge also includes data flow information between the previous module and the subsequent module. The method further comprises receiving a request to invoke the user simulation scenario and the request includes the input file source for the starting module. Traversing the vertices along the edges is performed in response to receiving the request and to the data flow information. The traversing includes executing the modules associated with each vertex beginning with the starting module in an order specified by the edges and the executing results in data being written to the output file destination for each vertex.

Further aspects of the invention are disclosed herein. The above discussed and other features and advantages of the invention will be appreciated and understood by those skilled in the art from the following detailed description and drawings.

BRIEF DESCRIPTION OF DRAWINGS

Referring to the exemplary drawings wherein like elements are numbered alike in the several FIGURES.

DETAILED DESCRIPTION

An embodiment of the present invention can be utilized to accelerate the new material introduction process by allowing the designers to get involved earlier in the new material development process. This can occur by allowing the designer to assess the results of new materials being tested, receive updates on the status of future materials currently being considered and by feeding requirements back into the material developers. In addition, it could be utilized to facilitate the introduction of new materials into products and assist in reducing the new material development process time. An embodiment of the present invention is a process simulation method that provides an integration framework for effectively utilizing material property prediction models, process simulation models and legacy material property systems to perform new material development. An embodiment of the present invention is built on a distributed web based computer system and includes a storage device for storing data relating to new material development including data associated with the process simulation. It also includes an integration component for building simulation scenarios and organizing material property prediction models; a database component for storing a single copy of common data; and a web based interface component for providing a common interface to the process simulation method.

Figure 1:
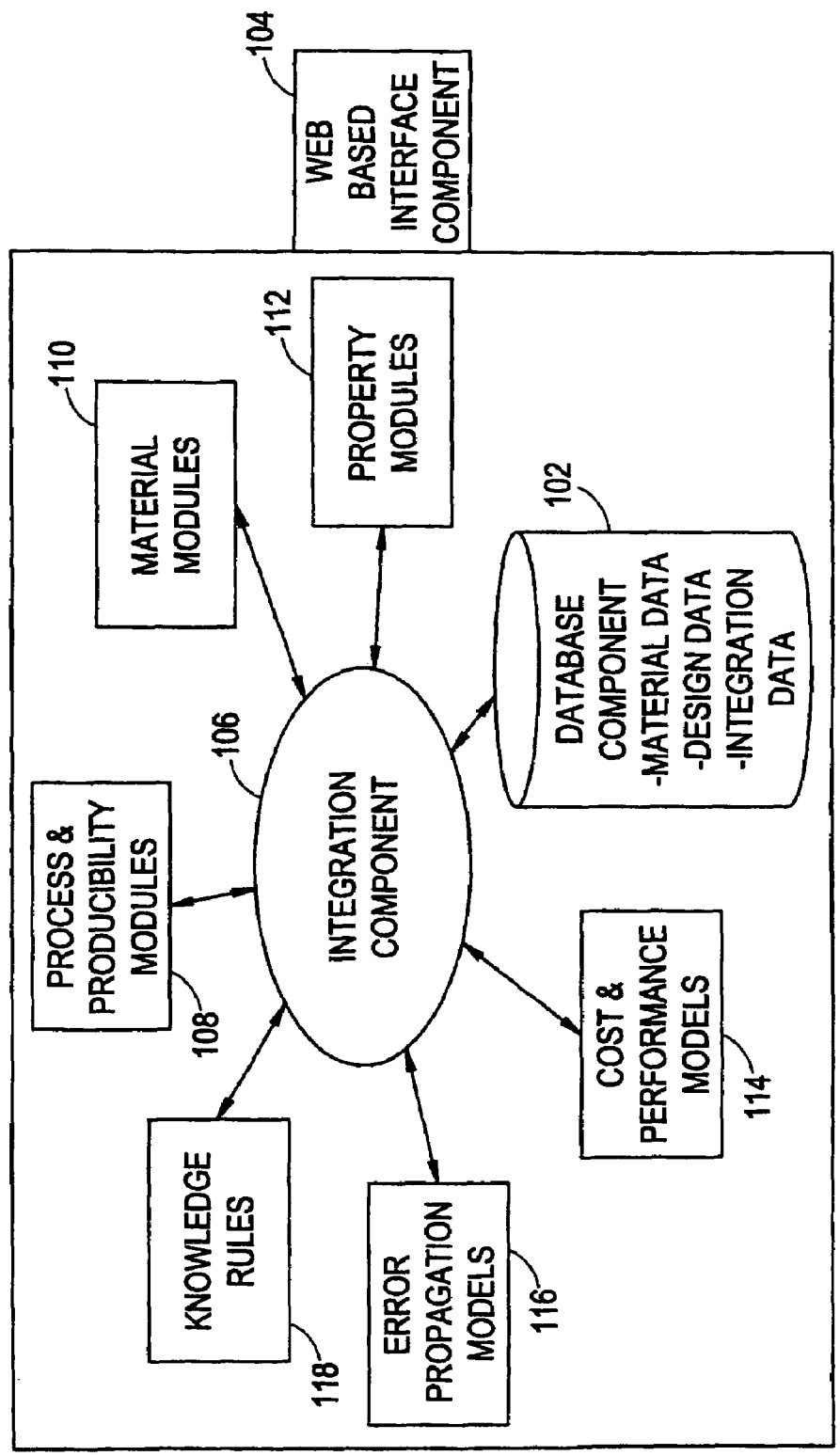
FIG. 1 is a block diagram of the components in an exemplary new material development system.

FIG. 1 is a block diagram of the components included in an exemplary embodiment of the present invention. The components include an integration component 106, a database component 102 and a web based interface component 104. The integration component 106 is utilized to control the processing and data transfer among various material development modules including: process and producibility modules 108, material modules 110, property modules 112, cost and performance models 114, error propagation models 116 and knowledge rules 118. All, or a subset of these material development modules can be utilized by designers and material developers to create simulation scenarios. In addition, the integration component 106 interfaces with the database component 102 for storing material development data and with the web based interface component 104 for providing access to data and processes associated with material development.

Referring to FIG. 1, the process and producibility modules 108 can include any commercially available or internal software tools to perform one more of the following: casting (e.g., ProCAST from UES Software Inc.), forging (e.g., DEFORM from Scientific Forming Technologies Corporation), heat treatment (e.g., DEFORM from Scientific Forming Technologies Corporation) and machining. Examples of materials modules 110 include software tools to perform the following functions: γ precipitation, grain size, phase analysis and grain growth modeling. Property modules 112 can include modules to perform functions such as flow stress, low cycle fatigue (LCF), ultimate tensile strength (UTS), creep and tensile modeling. Any cost and performance models 114 known in the art (e.g., COMPEAT from General Electric Company) can be utilized with an embodiment of the present invention. Additionally, error propagation models 16 such as those based on Monte Carlo, AURORA (FPI) [General Electric Co. FPI=Fast Probabilistic Integration], probabilistic models and Bayesian models can be utilized with an embodiment of the present invention. Knowledge rules 118 for materials and processes can also be integrated into the process simulation performed by the integration component 106. Data input and output from each of these material development modules can be stored through the database component 102. The modules and models utilized in a particular implementation will vary based on specific user requirements. Therefore, the list above includes examples of the types of material development modules that can be utilized in an embodiment of the present invention and is not meant to include an exhaustive list nor is it required that every implementation includes all of the material development modules mentioned above.

In an exemplary embodiment, the integration component 106 depicted in FIG. 1 includes a graph theoretic framework and an integration user interface, and it is based on an object oriented programming environment. The graph theoretic framework enables users to rapidly integrate new material modules by providing a seamless plug and play environment for materials development across discrete simulation scenarios. In an exemplary embodiment, the graph theoretic framework included in the integration component 108 is represented by a directed a-cyclic graph. The vertices of the graph represent individual material development modules and the edges of the graph represent relationships between the material development modules (e.g., can one module be performed directly after or before another module). A variety of material development modules, such as those depicted in FIG. 1, can be included in the graph that describes all possible vertices, or modules, and all possible edges, or relationships between the modules. The graph that contains all possible vertices and edges is referred to as the scenario library and an exemplary scenario library is described below in reference to FIG. 4. A simulation scenario can be selected by a designer or material developer by defining the adjacency matrix for the graph and then process simulation can be performed by traversing the resulting graph utilizing graph-coloring algorithms. Each module contained in the simulation scenario is performed in the order, relative to other modules, defined by the graph included in the scenario library. Data translations, as required between the material development modules, are invoked and performed as part of the processing. A data flow is created to correlate output data from one module with input data for another module.

Utilizing this type of framework provides the ability to down select designs across multiple scenarios using discrete optimization analysis. An embodiment of the present invention provides an automated way of running multiple scenarios and evaluating which scenario gives a better material. For example, a user may have two scenarios: (1) Unigraphics1—forging; and (2) Unigraphics2—forging. The user may want to determine which of these two scenarios is a better scenario. To do this, the user would create a graph that includes three modules with two edges going from the Unigraphics modules to the forging module. Therefore, running the simulation will result in two outputs (corresponding to the two edges) for forging and the user will have the ability to choose the better Unigraphics module. There can be several input edges to a sink module from a source module and there can be multiple outputs for a sink module as a result of the fact that it has more than one source. Multiple outputs for a sink module would result if the source modules were of the same type (e.g., Unigraphics). Each output would correspond to a particular path that was taken before that module. Therefore, discrete optimization analysis can be performed by analyzing multiple paths where there have been multiple numbers of some particular module type that performs the same functionality but has different input and output. The integration system is embedded within a framework that allows for multiple simulations within a selected scenario in order to perform robust design optimization. Several simulations can be executed using different input data and by storing the output data for each execution in a common database using a unique identifier. In addition, a user can select a scenario starting point at any vertex in the a-cyclic graph as long as the correct format and type of input data is available for the selected point of entry. In an exemplary embodiment, the graph theoretic framework is implemented in an object oriented programming environment that allows for new modules to be inserted into the system rapidly and with minimal interference to the existing system.

The integration user interface also included in the integration component 106 allows rapid set-up of data essential for the simulation of processing scenarios. Communication between the web based database component 102 and the integration component 106 is also enabled through this integration interface. The integration user interface provides the ability to select a process scenario based on the scenario library and to rapidly set up input and output data for the selected scenario. The input and output files can be specified and stored in a common database for re-runs of portions of the simulation and for access by users of the system through the integration user interface. The integration user interface also provides the ability to couple with existing optimization and error analysis software for the purpose of process design within a selected scenario. The graph theory is a method to invoke a simulation for a particular scenario, a user can wrap this simulation within an optimization code or error analysis code which essentially calls this scenario simulation multiple times corresponding to different inputs. The integration user interface can be accessed through the web site and provides the communication link for the transfer of data between the integration component 106 and the common materials and product design database, or database component 102.

In an exemplary embodiment, the integration component 106 is built and implemented using an object oriented programming environment. An abstract class is utilized to represent a wrapper capable of inserting any generic material development module into the integration framework. Derived classes are implemented to wrap specific executables for each of the individual modules. A structured file-system is utilized in conjunction with the module wrappers consisting of a directory for common executables, a directory to perform process integration and a directory to store information on various material development modules including material process, microstructure and property models.

Figure 2:
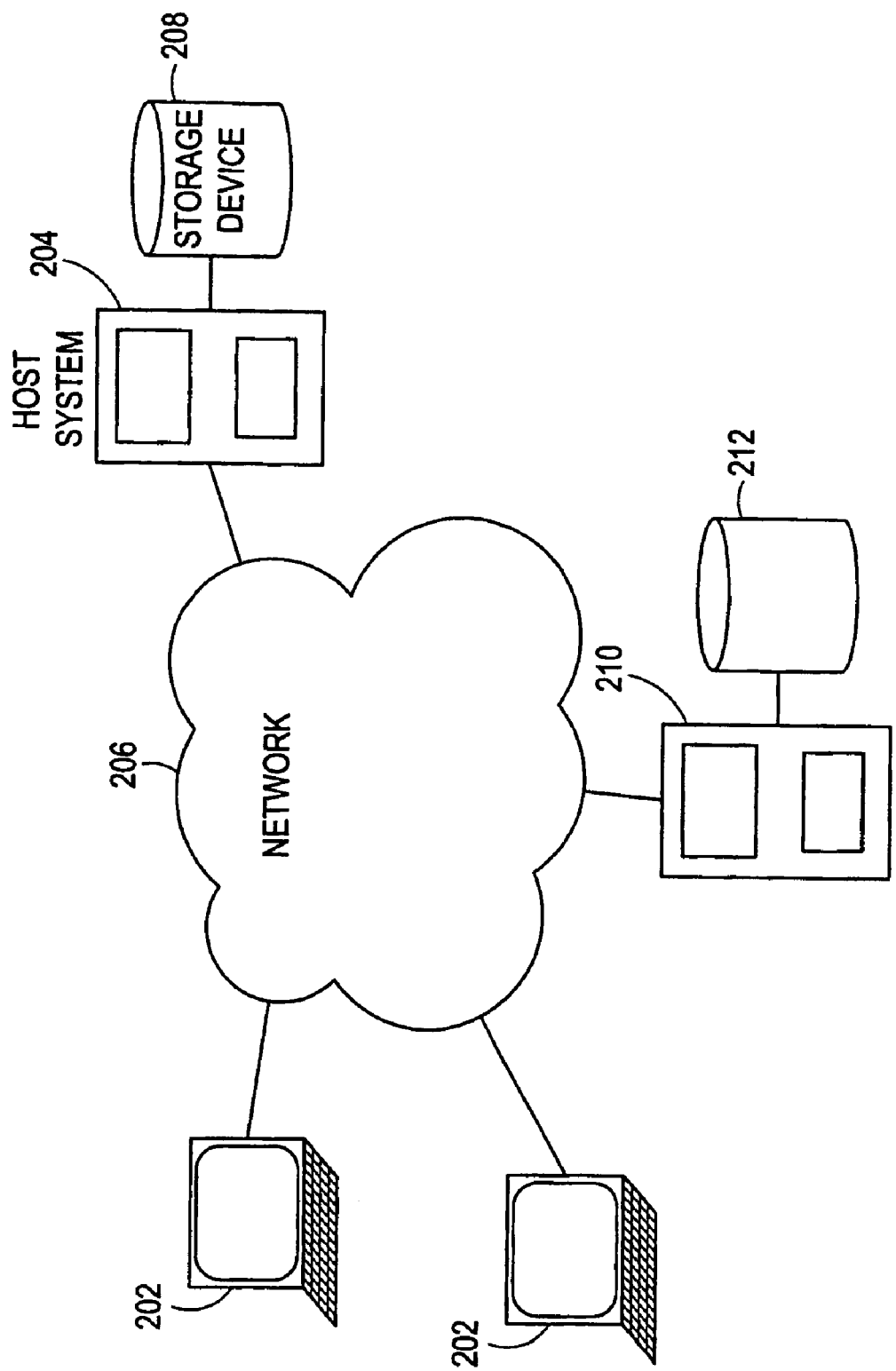
FIG. 2 is a block diagram of an exemplary system for performing new material development.

FIG. 2 is a block diagram of an exemplary system for performing process simulation for new material development using the web based interface component 104, the integration component 106 and the database component 102. The web based interface component 104 is designed and implemented to provide a user-friendly interface for user access to the integrated system that can be tailored based on the attributes of a particular user. The system can be accessed by a plurality of users simultaneously and also provides an authentication check through a web login form. Users, through the use of dynamic web pages, can store information related to any of the following categories: material data, design data and integration data. They can also retrieve any relevant information from web pages and store the data into their local computer storage systems. In addition, the web based interface component 104 is linked with other computer modules and models that reside in other heterogeneous computer systems. Those systems are connected through a network 206 such as a LAN or a WAN. The web based interface component 104 serves as a central agent to exchange information, define data flow and to initiate a storage mechanism. With the web based interface component 104, users can launch and monitor integration runs using a plurality of computer modules throughout the network.

The system of FIG. 2 includes user systems 202 through which a user (e.g., a designer, a material developer, a supplier, an external customer) can make a request to an application program on the host system 204 to access particular material development records stored on the storage device 208 or to perform process simulation utilizing particular material development modules and input data stored on the storage device 208. The request from the user is initiated through the integration user interface discussed previously. Additionally, these requests for access to the process simulation and material development data could come from a computer application running on the host system 204 or from a remote host system 210. In addition, the material development modules, the material development records and other data could be stored on a remote storage device 212 or on a user system 202. In an exemplary embodiment users can be physically located in one or more locations. In an exemplary embodiment, the host system 204 executes programs that provide access to the integration component 106 to initiate process simulation. The user systems 202 can be directly connected to the host system 204 or they can be coupled to the host system 204 via the network 206. Each user system 202 may be implemented using a general-purpose computer executing a computer program for carrying out the processes described herein. The user systems 202 may be personal computers or host attached terminals. If the user systems 202 are personal computers, the processing described herein may be shared by a user system 202 and the host system 204 by providing an applet to the user system 202.

The network 206 may be any type of known network including a local area network (LAN), a wide area network (WAN), an intranet, or a global network (e.g., Internet). A user system 202 may be coupled to the host system 204 through multiple networks (e.g., intranet and Internet) so that not all user systems 202 are required to be coupled to the host system 204 through the same network. One or more of the user systems 202, host system 204 and remote host system 210 may be connected to the network 206 in a wireless fashion and the network 206 may be a wireless network. In an exemplary embodiment, the network 206 is the Internet and each user system 202 executes a user interface application to directly connect to the host system 204. In another embodiment, a user system 202 may execute a web browser to contact the host system 204 through the network 206. Alternatively, a user system 202 may be implemented using a device programmed primarily for accessing the network 206 such as WebTV.

The host system 204 may be implemented using a server operating in response to a computer program stored in a storage medium accessible by the server. The host system 204 may operate as a network server (often referred to as a web server) to communicate with the user systems 202. The host system 204 handles sending and receiving information to and from user systems 202 and can perform associated tasks. The host system also either contains the material development modules or can access and the material development modules if they are located on a system that is remote from the host system 204. The host system, through the integration component 106 initiates the execution of the material development modules. The host system 204 may also include a firewall to prevent unauthorized access to the host system 204 and enforce any limitations on authorized access. For instance, an administrator may have access to the entire system and have authority to modify the scenario library and other portions of the system and a designer may only be permitted to modify a scenario that the designer created and the resulting input and output data from a scenario initiated by the designer. In an exemplary embodiment, the administrator has the ability to add new users, delete users and edit user privileges. The firewall may be implemented using conventional hardware and/or software as is known in the art.

The host system 204 also operates as an application server. The host system 204 executes one or more application programs in the integration component 106 to perform process simulation for new material development and to access material development data. Processing may be shared by the user system 202 and the host system 204 by providing an application (e.g., java applet) to the user system 202. Alternatively, the user system 202 can include a stand-alone software application for performing a portion of the processing described herein. It is understood that separate servers may be used to implement the network server functions and the application server functions. Alternatively, the network server, firewall and the application server can be implemented by a single server executing computer programs to perform the requisite functions.

The storage device 208 may be implemented using a variety of devices for storing electronic information such as a file transfer protocol (FTP) server. It is understood that the storage device 208 may be implemented using memory contained in the host system 204 or it may be a separate physical device. The storage device 208 contains a variety of information related to performing new material development including the database component 102. The database component 102 includes persistent data related to material development and design practices as described in reference to FIG. 3 below. The host system 204 may also operate as a database server and coordinate access to application data including data stored on the storage device 208. The data stored in the database component 102 can be physically stored as a single database with access restricted based on user characteristics or it can be physically stored in a variety of databases including portions of the database on the user systems 202, the remote storage device 212, the host system 204 or the remote host system 210. In an exemplary embodiment, the database component 102 is implemented using a relational database system and the database system provides different views of the data to different users based on user characteristics.

Figure 3:
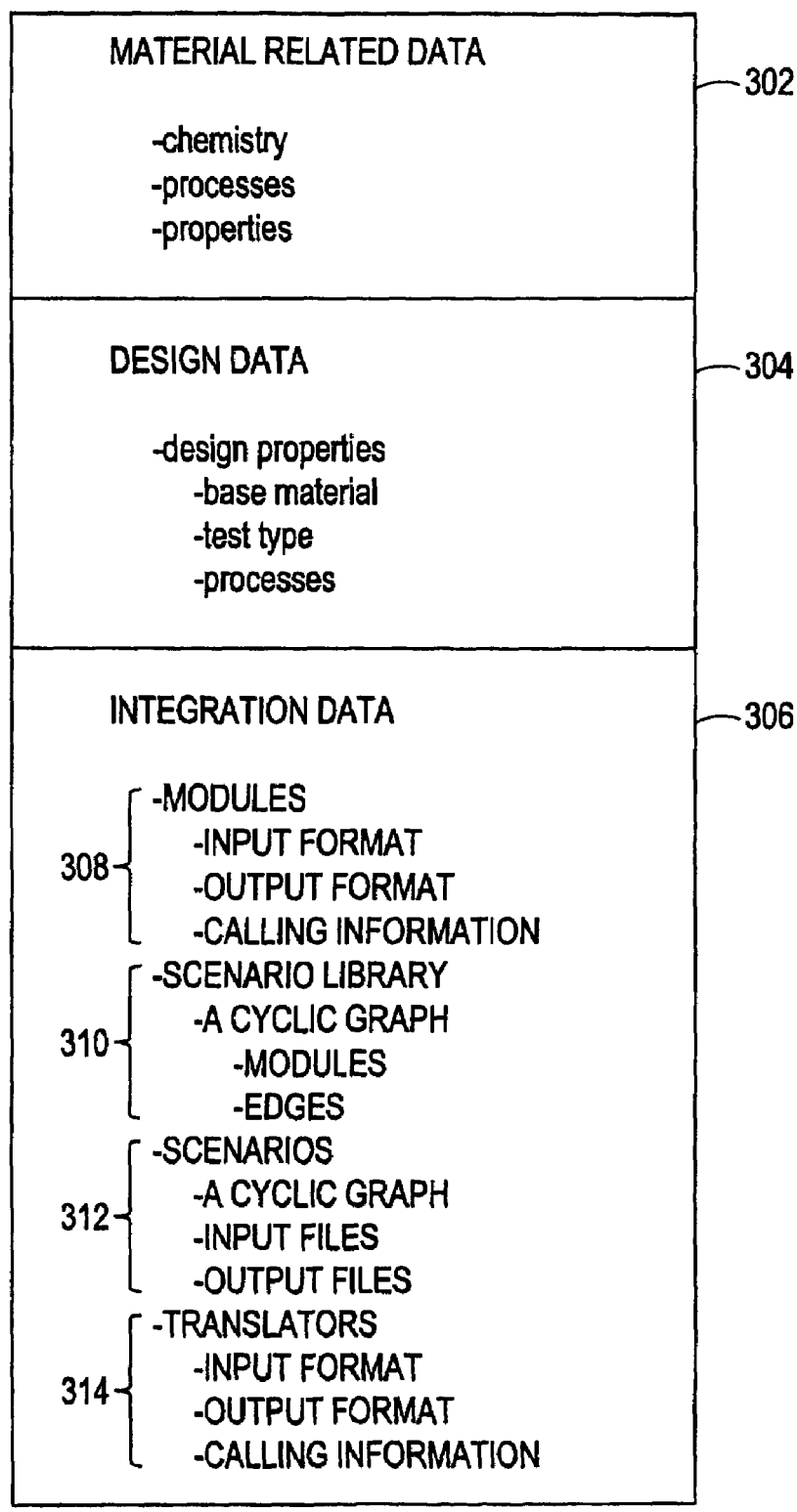
FIG. 3 is an exemplary embodiment of a database layout for performing new material development.

FIG. 3 is an exemplary embodiment of a database layout of the database component 102 of the present invention. The database component 102 is utilized to store persistent data related to material development and design practices on the storage device 208. The database can be divided into three logical segments: material related data 302, design data 304 and integration data 306. Material related data 302 includes chemistry, processes and properties as separate and connectable entities. Each of these entities includes a unique name that is generated by combining creator, time of creation and serial number. These entities are interconnected and can be retrieved based on user selected criteria. Design data 304 includes design properties utilized by the designer. Each design property is stored using a unique identification number and includes attributes describing all related information such as base material, test type and processes used to manufacture the sample.

Integration data 306 includes modules 308, the scenario library 310, user simulation scenarios 312 and data describing the translators 314. The data for modules 308 can include, for each module, the input format, the output format and calling information (e.g., parameters expected, location of module software). The library of scenarios 310 includes modules and relationships between modules for each possible scenario. In an exemplary embodiment, the scenarios are stored as a-cyclic graphs with the modules being represented as vertices and the relationships between modules being represented as edges. The data about the user simulation scenarios 312 is also stored as an a-cyclic graph and includes the modules in the user defined scenario as well as a location of the input files and output files and any input parameters. The data related to translators 314 includes input format, output format and calling format to perform the translation (e.g., parameters expected, location of translator).

Figure 4:
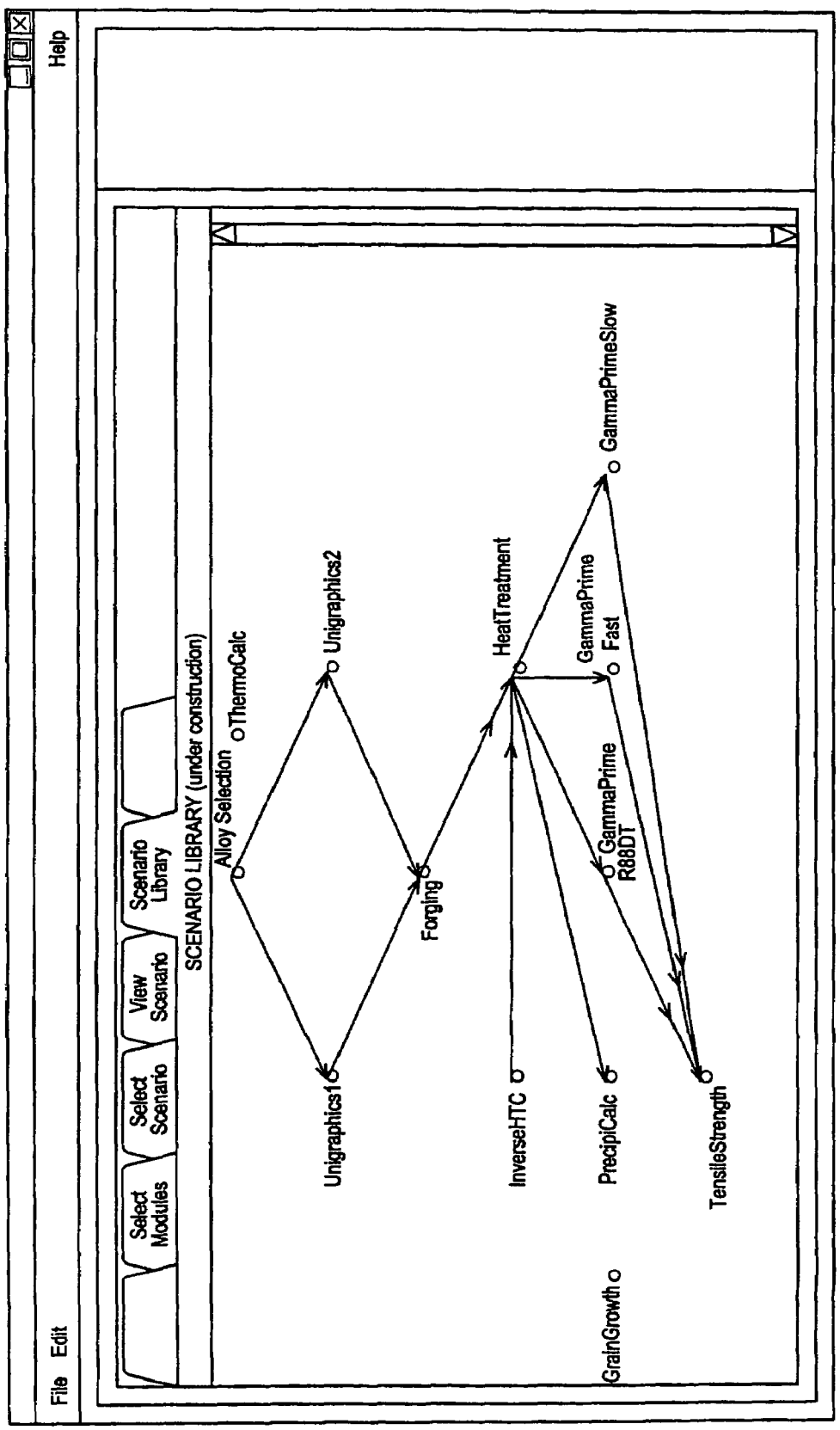
FIG. 4 is an exemplary user interface for displaying the scenario library.

FIG. 4 is an exemplary user interface, from the integration user interface, for displaying the scenario library. The scenario library contains all possible relationships between material development modules. As depicted in FIG. 4, the scenario library is represented as an a-cyclic graph where the vertices represent material development modules and the edges represent an order relationship between the modules. For example, as depicted in FIG. 4, the output data from the inverse heat transfer coefficient (HTC) module and the output data from the forging module are both input into the heat treatment module. Therefore, both the inverse HTC module and the forging module must be executed prior to executing the heat treatment module because the modules are of different types. However, in the case of the Unigraphics1 module and the Unigraphics2 module being input to the forging module, either one or both of the Unigraphics modules must be executed prior to executing the forging module because the Unigraphics modules are of the same type. Running both the Unigraphics modules can aid in performing discrete optimization analysis as described previously. In order for two material development modules to be of the same type they must have a common data input and data output format. The edges, or relationships between the modules, can be assigned by inputting entries in an adjacency matrix that is associated with the graph depicted in FIG. 4. Using an a-cyclic graph and an associated adjacency matrix along with the object oriented abstract class described above, can make it easy to insert new modules into the scenario library. Once the adjacency matrix is updated, the associated graph, such as the one depicted in FIG. 4, is automatically updated to reflect the change. Likewise, removing modules from the scenario library can also be performed quickly using an embodiment of the present invention. The scenario library can be viewed by end-users for use in setting up individual simulation scenarios.

Figure 5:
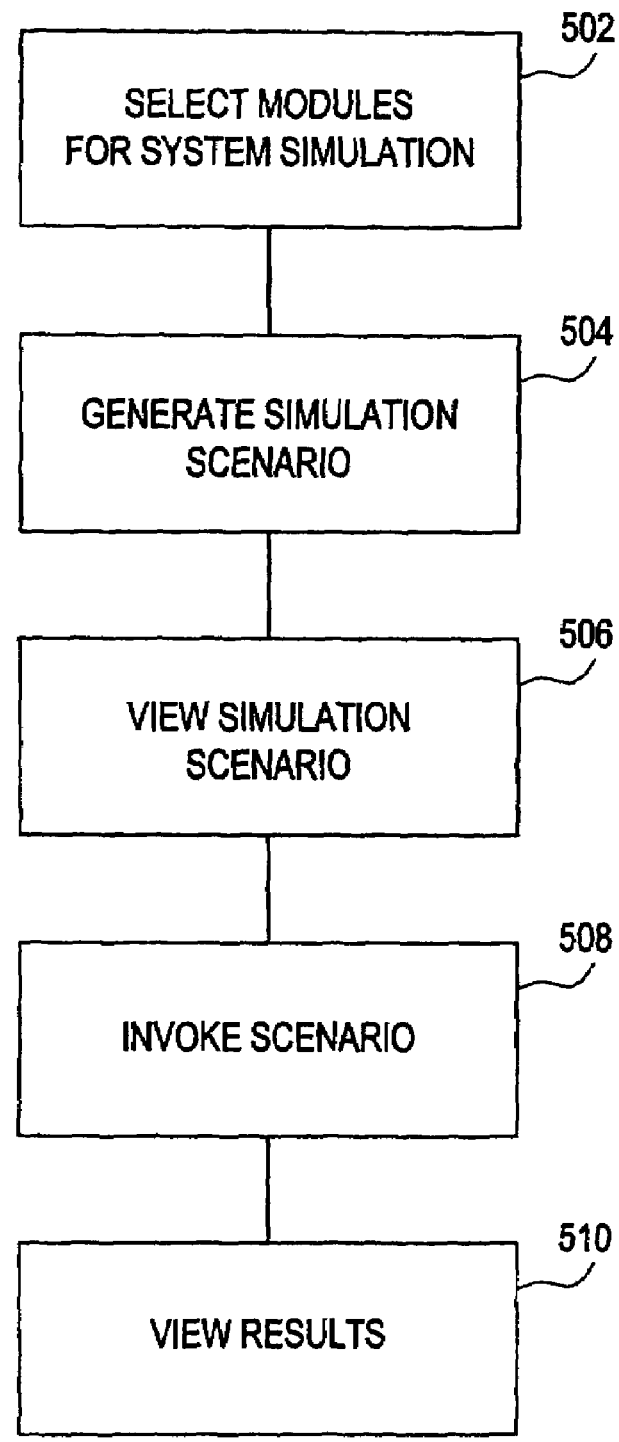
FIG. 5 is a block diagram of an exemplary embodiment of an overall process for performing new material development.
Figure 6:
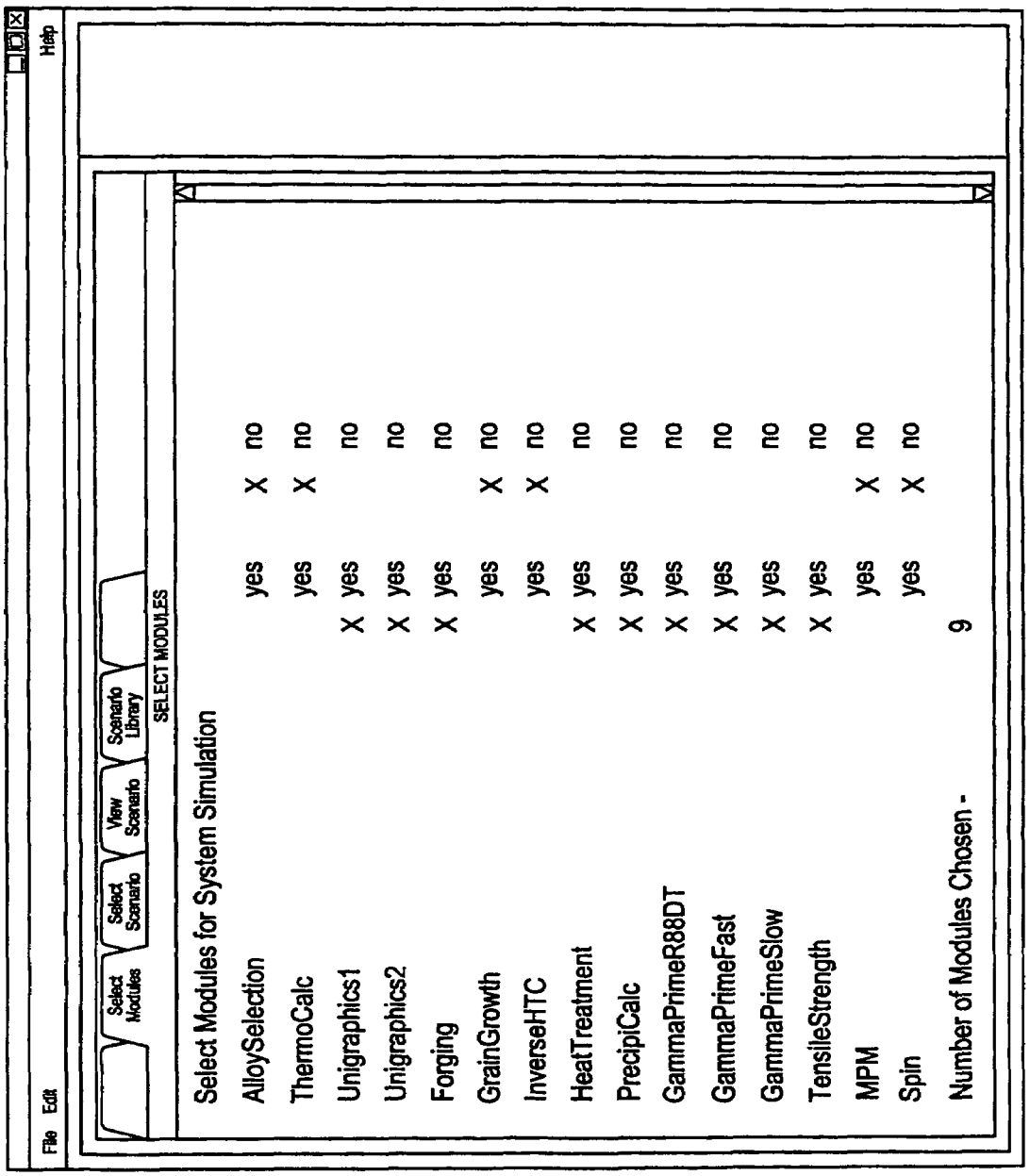
FIG. 6 is an exemplary user interface for selecting modules to be included in a user scenario.
Figure 8:
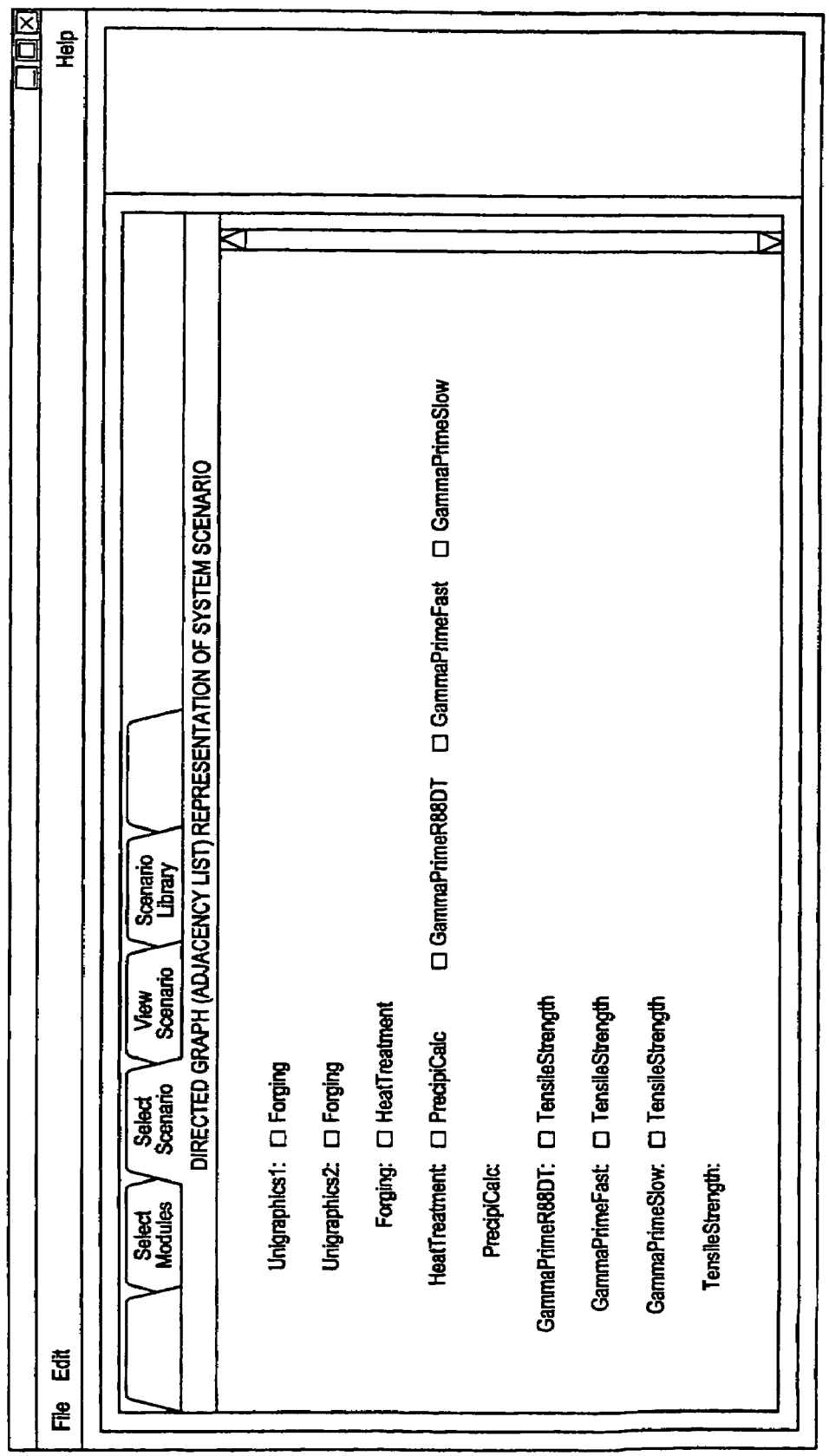
FIG. 8 is an exemplary user interface for viewing an adjacency list associated with a user scenario.

FIG. 5 is a block diagram of an exemplary embodiment of an overall process for performing process simulation during new material development. At step 502, an end-user selects material development modules to be included in a simulation scenario. FIG. 6 depicts an exemplary user interface, included in the integration user interface, for selecting material development modules to be included in a simulation scenario. As shown in FIG. 6, all available material development modules are listed along with a selection box to either select or deselect the particular material development module. The user selects the material development modules to be included in the simulation scenario. Then, as shown in the exemplary adjacency list user interface depicted in FIG. 8, the user can select a sub-set of the edges included in the scenario library. Referring to FIG. 8, the user can select to include only one of the Unigraphics modules or only one or two of the gamma prime modules, thereby reducing the number of edges and material development modules included in the user scenario. Alternatively, the user can leave all the edges in the scenario and execute the user scenario using all of the edges depicted in FIG. 8. Referring back to FIG. 5, at step 504, an integration scenario is generated based on the material development modules selected by the user in step 502. The simulation scenario is generated by software included in the integration component 106. The software verifies that the material development modules selected by the user to be included in the simulation scenario include a subset of the scenario library. The software checks that the proper relationships exist between the selected modules so that the simulation can create complete data results. If proper relationships do not exist, then the user is notified that an error exists and is prompted to supply a collection of modules that represents a subset of the scenario library. For example, referring to FIG. 4, the user will be prevented from setting up a simulation scenario that includes only alloy selection and forging, and not either Unigraphics1 or Unigraphics2 because input to forging includes output from either (since they are the same type) Unigraphics1 and Unigraphics2.

Figure 7:
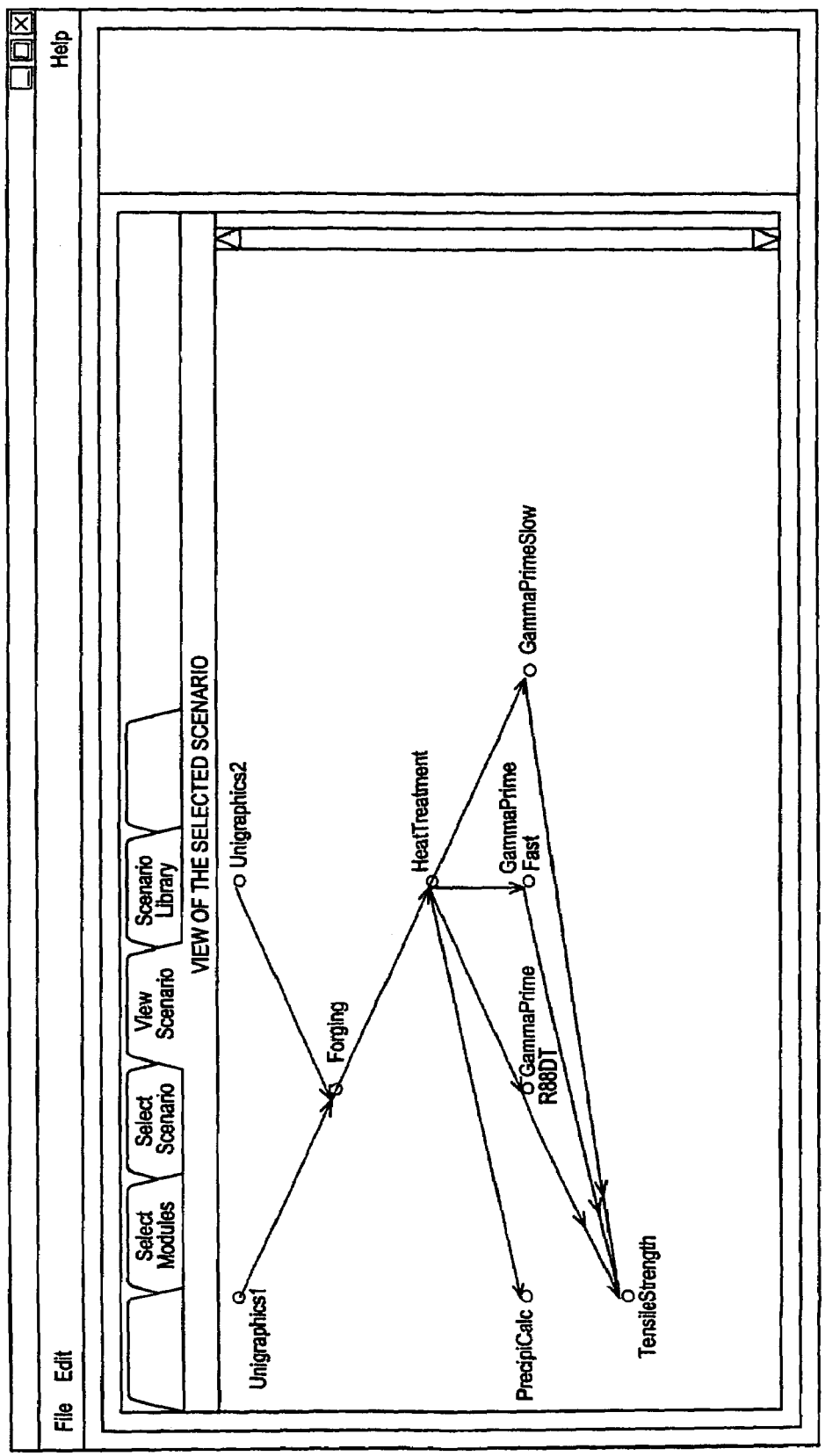
FIG. 7 is an exemplary user interface for viewing a user scenario that includes modules selected by the user.

Next, at step 506, the user can view the simulation scenario using an interface, that is part of the integration user interface, such as the one depicted in FIG. 7. FIG. 7 is an exemplary user interface for viewing a system scenario that includes material development modules selected by the user. FIG. 7 includes a graphic representation of the simulation scenario requested by the user. FIG. 7 includes vertices for each material development module contained in the scenario as well as a directed edge to indicate order of execution. At step 508 in FIG. 5, the user simulation scenario is invoked by the user. The user can choose to step through the simulation and view the results after each module is executed. Alternatively, the user can choose to have the entire user simulation scenario executed with user viewing the results after all the modules in the scenario have been executed.

If the user chooses to invoke the entire simulation scenario, software located in the integration component 106 will send a command to begin execution of the starting module (in FIG. 7 there are two starting modules Unigraphics1 and Unigraphics2) along with the associated input file and any parameters required by the starting module. In an exemplary embodiment, invoking the scenario includes specifying the location of input files and parameters as well as a location to store intermediate and final output files. In the simulation scenario depicted in FIG. 7, after the starting modules (Unigraphics1 and Unigraphics2) are complete, the software located in the integration component 106 will take the outputs from the starting modules and use it as input to the next module, in this example forging. In addition, the software will store copies of the outputs in the database component 102. Next, the software will initiate the execution of the forging module. Processing continues in this fashion until the tensile strength and precipicalc modules have completed execution. Finally, at step 510, the user can view intermediate and final results of the simulation scenario. This can include reviewing execution statistics as well as viewing the output and input files through the database component 102.

The scenario library described in reference to an exemplary embodiment of the present invention includes an example of the types of material development modules and associated edges that could be included in a material development scenario. Many other configurations of the scenario library are possible and the exact combination of modules and edges are based on specific implementation requirements. A sub-set of the material development modules described in the exemplary scenario library may be included in the scenario library at a particular implementation and/or additional modules may be included. In addition, an embodiment of the present invention is not limited to materials development applications but may be applied to any multistage process that includes units that can be connected in multiple ways.

An embodiment of the present invention provides for an integrated approach to new material development that includes an integration framework for pulling together material development data and simulation modules. This can enable the collaboration between designers and material developers through data sharing and exchange throughout the entire cycle of material development in order to accelerate the new material insertion. An embodiment of the present invention utilizes an a-cyclic graph approach to setting up and executing simulation scenarios. This can result in more complete and accurate simulations. The use of a central framework for performing simulations using a common user interface and database eliminates the need for the user to be familiar with a variety of module user interfaces and to be aware of the location and format of the input and output data. Having the data tracked by an central database component allows for data consistency and simulation accuracy because the correct version of the data is being accessed.

As described above, the embodiments of the invention may be embodied in the form of computer-implemented processes and apparatuses for practicing those processes. Embodiments of the invention may also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. An embodiment of the invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

The invention claimed is:

1. A method for simulating new materials, the method comprising:
   receiving a user simulation scenario from a user, wherein:
   said user simulation scenario is in a-cyclic graph format and includes a plurality of material development modules represented as vertices including a starting module, wherein the material development modules comprise material design and testing modules configured to predict material characteristics resulting from one or more material design simulations;
   each said vertex includes material characteristic data information including at least one input file source and at least one output file destination;
   relationships between said modules are represented as edges;
   each said edge includes at least one of previous module and subsequent module; and
   each said edge includes data flow information between said previous module and said subsequent module;
   receiving a request to invoke said user simulation scenario, wherein said request includes input file source for said starting module;
   traversing said vertices along said edge in response to receiving said request and to said data flow information, wherein said traversing includes executing said modules associated with each said vertex beginning with said starting module in an order specified by said edges, and said executing produces results including material characteristic data written to said output file destination for each said vertex; and
   outputting the results to a central workstation for collaborative material development via one or more remote user interfaces.

2. The method of claim 1 further comprising creating said user simulation scenario, wherein said creating includes:
   receiving said plurality of material development modules and said edges from said user wherein said plurality of material development modules and said edges are selected from a library of available material development modules and associated edges;
   verifying that said plurality of material development modules and said edges form a subset of a scenario library;
   generating said user simulation scenario in response to said verifying; and
   confirming with said user that said user simulation scenario is correct in response to said generating.

3. The method of claim 2 wherein said scenario library includes said library of available material development modules and all possible relationships between said material development modules represented in a-cyclic graph format.

4. The method of claim 1 further comprising providing the results of said traversing to said user.

5. The method of claim 4 wherein said providing includes allowing said user to browse all or a subset of said material characteristic data written to said output file destination for each said vertex and said input file source.

6. The method of claim 4 wherein said providing includes transmitting all or a subset of said material characteristic data written to said output file destination for each said vertex and said input file source.

7. The method of claim 1 further comprising providing said user with access to a common materials development database that includes said material characteristic data written to said output file destination for each said vertex and said input file source.

8. The method of claim 7 wherein said common materials development database includes material related data, design data and integration data.

9. The method of claim 7 wherein said common materials development database is in a relational database format.

10. The method of claim 7 wherein said common materials development database includes said material characteristic data information.

11. The method of claim 1 wherein said user is a designer.

12. The method of claim 1 wherein said user is a material developer.

13. The method of claim 1 wherein said user is a customer.

14. The method of claim 1 wherein said user is a supplier.

15. The method of claim 1 wherein said material development modules include a process and producibility module.

16. The method of claim 1 wherein said material development modules include a material module.

17. The method of claim 1 wherein said material development modules include a property module.

18. The method of claim 1 wherein said material development modules include a cost and performance model.

19. The method of claim 1 wherein said material development modules include an error propagation model.

20. A system for simulating new materials, the system comprising:
   a network;
   a user system in communication with said network;
   a first storage device including a database component; and
   a first host system in communication with said network and said storage device, said first host system including an integration component configured to:
   receive a user simulation scenario from a user system via said network, wherein:
   said user simulation scenario is in a-cyclic graph format and includes a plurality of material development modules represented as vertices including a starting module;
   each said vertex includes material characteristic data information including at least one input file source and at least one output file destination;
   relationships between said modules are represented as edges;

each said edge includes at least one of previous module and subsequent module; and each said edge includes data flow information between said previous module and said subsequent module;

receive a request to invoke said user simulation scenario via said network, wherein said request includes said input file source for said starting module;

traverse said vertices along said edges in response to receiving said request and to said data flow information, wherein said traversing includes executing said modules associated with each said vertex beginning with said starting module in an order specified by said edges, and said executing produces results including material characteristic data written to said output file destination located on said database component for each said vertex; and output the results to the user system, or the first storage device, or the first host system, or a combination thereof, for collaborative material development via one or more remote user interfaces.

21. The system of claim 20 further including a second host system in communication with said network and wherein said second host system includes one of said plurality of material development modules.

22. The system of claim 20 further including a second storage device in communication with said network and wherein a portion of said database component is located on said second storage device.

23. The system of claim 20 wherein said network is the Internet.

24. The system of claim 20 wherein said network is an intranet.

25. The system of claim 20 wherein said network is a LAN.

26. The system of claim 20 wherein said network is a WAN.

27. A computer-readable medium for simulating new materials, the computer-readable medium comprising:

a storage medium readable by a processing circuit and storing instructions for execution by the processing circuit configured to:

receive a user simulation scenario from a user, wherein:

said user simulation scenario is in a-cyclic graph format and includes a plurality of material development modules represented as vertices including a starting module, wherein the material development modules comprise material design and testing modules configured to predict material characteristics resulting from one or more material design simulations;

each said vertex includes material characteristic data information including at least one input file source and at least one output file destination;

relationships between said modules are represented as edges;

each said edge includes at least one of previous module and subsequent module; and each said edge includes data flow information between said previous module and said subsequent module;

receive a request to invoke said user simulation scenario, wherein said request includes said input file source for said starting module;

traverse said vertices along said edges in response to receiving said request and to said data flow information, wherein said traversing includes executing said modules associated with each said vertex beginning with said starting module in an order specified by said edges, and said executing produces results including material characteristic data written to said output file destination for each said vertex; and output the results to a central workstation for collaborative material development via one or more remote user interfaces.

28. The computer-readable medium of claim 27, wherein said instructions are built based on an object oriented framework.

29. The method of claim 1, wherein said material design and testing modules comprise material modules including tools configured to test precipitation, grain size, phase analysis, grain growth, or combinations thereof.

30. The method of claim 1, wherein said material design and testing modules comprise property modules including tools configured to test flow stress, low cycle fatigue, ultimate tensile strength, tensile strength, or combinations thereof.

31. The method of claim 1, wherein said material design and testing modules comprise a material module, a property module, a cost and performance model, an error propagation model, or combinations thereof.

32. The system of claim 20, wherein said material development modules comprise material modules including tools configured to test precipitation, grain size, phase analysis, grain growth, or combinations thereof.

33. The system of claim 20, wherein said material development modules comprise property modules including tools configured to test flow stress, low cycle fatigue, ultimate tensile strength, tensile strength, or combinations thereof.

34. The system of claim 20, wherein said material development modules comprise a material module, a property module, a cost and performance model, an error propagation model, or combinations thereof.

35. The computer-readable medium of claim 27, wherein said material development modules comprise material modules including tools configured to test precipitation, grain size, phase analysis, grain growth, or combinations thereof.

36. The computer-readable medium of claim 27, wherein said material development modules comprise property modules including tools configured to test flow stress, low cycle fatigue, ultimate tensile strength, tensile strength, or combinations thereof.

37. The computer-readable medium of claim 27, wherein said material development modules comprise a material module, a property module, a cost and performance model, an error propagation model, or combinations thereof.

* * * * *

UNITED STATES PATENT AND TRADEMARK OFFICE
CERTIFICATE OF CORRECTION

| | | |
|---|---|---|
| PATENT NO. | : 7,181,381 B1 | Page 1 of 1 |
| APPLICATION NO. | : 10/065740 | |
| DATED | : February 20, 2007 | |
| INVENTOR(S) | : Srikanth Akkaram, Dongming Gao and Youdong Zhou | |

It is certified that error appears in the above-identified patent and that said Letters Patent is hereby corrected as shown below:

In column 1, line 9, the portion reading "number 212976" should read --number F33615-00-C-5215.--

Signed and Sealed this

Nineteenth Day of June, 2007

JON W. DUDAS
*Director of the United States Patent and Trademark Office*